(12) United States Patent
Takano et al.

(10) Patent No.: US 7,435,937 B2
(45) Date of Patent: Oct. 14, 2008

(54) PHOTODETECTION APPARATUS WITH OPERATION-MODE SWITCHING BETWEEN CURRENT OUTPUT MODE AND VOLTAGE OUTPUT MODE

(75) Inventors: Yoh Takano, Ogaki (JP); Atsushi Wada, Ogaki (JP); Kuniyuki Tani, Ogaki (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 11/390,424

(22) Filed: Mar. 28, 2006

(65) Prior Publication Data
US 2006/0249659 A1 Nov. 9, 2006

(30) Foreign Application Priority Data
Mar. 28, 2005 (JP) .............................. 2005-092914

(51) Int. Cl.
*G01J 1/44* (2006.01)
*H01L 27/00* (2006.01)
*H04N 3/14* (2006.01)
(52) U.S. Cl. ................. 250/214 R; 348/308; 250/208.1
(58) Field of Classification Search ............. 250/214 R, 250/208.1; 348/308
See application file for complete search history.

(56) References Cited

FOREIGN PATENT DOCUMENTS

JP          11153823 A    *    6/1999

OTHER PUBLICATIONS

Ikebe et al., "Evaluation of a Functional Initializing for a CMOS-Image Sensor", Technical Report of IEICE, vol. 103, No. 298, pp. 19-24 (Sep. 2003).

* cited by examiner

*Primary Examiner*—Thanh X Luu
(74) *Attorney, Agent, or Firm*—McDermott Will & Emery LLP

(57) ABSTRACT

A set of voltage output units outputs the light intensity detected by a photodetection device in the form of a voltage value. With the set of voltage output units, the capacitance of the cathode terminal of a photodiode PD provided within the pixel is charged or discharged using the photoelectric current. A current output unit outputs photoelectric current Iph flowing from the photodetection device. The current output unit includes a current output transistor provided between one terminal of the photodetection device and the data line. A pixel circuit effects control of the pixel so as to activate either the set of the voltage output units or the current output unit, thereby outputting either voltage value or photoelectric current to the data line connected to the pixel.

7 Claims, 5 Drawing Sheets

RELATED ART     200

PHOTODETECTION APPARATUS WITH OPERATION-MODE SWITCHING BETWEEN CURRENT OUTPUT MODE AND VOLTAGE OUTPUT MODE

BACKGROUND OF THE INVENTION

1. Field of the Invention

The present invention relates to a photodetection apparatus such as an image sensor and so forth, and particularly to a photodetection apparatus with an improved dynamic range.

2. Description of the Related Art

In recent years, various imaging devices such as digital still cameras, digital video cameras, and so forth, employ a CCD (Charge Coupled Device), or a CMOS (Complementary Metal Oxide Semiconductor) image sensor.

Known examples of the advantages of employing a CMOS image sensor includes: the fact that CMOS image sensors can be manufactured with the same production line as with ordinary chips, and furthermore, such a CMOS image sensor can be formed together with a peripheral circuit in the form of a single chip; and the fact that the CMOS image sensor can operate at a lower voltage than that of CCDs, thereby exhibiting lower power consumption than that of CCDs.

Each pixel of the CMOS sensor comprises a single photodiode and switches using MOSFETs. That is to say, the CMOS sensor has a configuration in which photodiodes are arrayed in the form of a matrix, and switches are provided for each photodiode. With such an arrangement, charge is read out from the photodiodes in pixel increments by sequentially switching the switches. For example, a pixel circuit for such a CMOS image sensor is described in Non-Patent Document 1 (Ikebe et al. "Evaluation of a Functional Initializing for a CMOS-Image Sensor", Technical Report of IEICE (The Institute of Electronics, Information and Communication Engineers), vol. 103, No. 298, pp. 19-24 (September 2003)).

FIG. 1 is a circuit diagram which shows a configuration of a pixel circuit 200 of a conventional CMOS image sensor described in FIG. 1 of the Non-Patent Document 1. The pixel circuit 200 includes a photodiode PD, a reset transistor M1, an amplifier transistor M2, and an output transistor M3. Each of the reset transistor M1, amplifier transistor M2, and output transistor M3, is an N-channel MOSFET. The reset transistor M1 and the photodiode PD are connected in series between the power supply voltage Vdd and the ground voltage GND. The source terminal of the reset transistor M1 is connected to the photodiode PD. On the other hand, the power supply voltage Vdd is applied to the drain terminal of the reset transistor M1. The gate terminal of the reset transistor M1 is an input terminal for receiving the reset signal RST.

The cathode terminal of the photodiode PD, connected to the reset transistor M1, is also connected to the gate terminal of the amplifier transistor M2. With regard to the amplifier transistor M2, the power supply voltage Vdd is applied to the drain terminal thereof, and the source terminal thereof is connected to the drain terminal of the output transistor M3. Thus, the amplifier transistor M2 functions as a source follower amplifier. The source terminal of the output transistor M3 is connected to a data line LD which is provided for each column of the CMOS image sensor.

With the image circuit 200 having such a configuration, upon the gate terminal of the reset transistor M1 receiving the high level reset signal RST, the reset transistor M1 is turned on. As a result, the power supply voltage Vdd is applied to the photodiode PD, thereby charging the cathode terminal of the photodiode PD with the power supply voltage. Then, the reset transistor M1 is turned off. In this state, upon the photodiode PD receiving light, photoelectric current flows, thereby discharging the charge accumulated in the cathode terminal of the photodiode PD. At this time, the voltage of the cathode terminal of the photodiode PD changes corresponding to the light intensity and the exposure time. The amplifier transistor M2 outputs the voltage of the cathode terminal of the photodiode PD.

After a predetermined exposure time, the selection signal SEL is switched to the high level. As a result, the output transistor M3 is turned on, and the voltage corresponding to the light amount received by the photodiode PD is output to the data line LD. Thus, an external circuit can read out the received light amount for each pixel.

Now, description will be made regarding the dynamic range of the pixel circuit of the conventional CMOS sensor shown in FIG. 1. As described above, the aforementioned pixel circuit detects the received light amount for each pixel as follows. First, the photodiode PD is charged with the power supply voltage Vdd. Then, the charge accumulated in the cathode terminal of the photodiode PD in the exposure time is discharged. Subsequently, the remaining charge amount is converted into a voltage, whereby the received light amount is measured. Let us consider a case in which the photodiode PD receives extremely high-intensity light. This leads to the remaining charge amount becoming zero in the exposure time. In this case, the pixel circuit 200 cannot completely detect the light amount input to the photodiode PD.

In order to solve the aforementioned problem, let us consider an arrangement in which the exposure time is reduced. Such an arrangement can detect higher-intensity light. However, such an arrangement is not sufficiently sensitive to detect a low-intensity light. As described above, the conventional pixel circuit 200 has a problem that the dynamic range is limited by the initial charge amount accumulated in the cathode terminal of the photodiode PD in the reset state. The initial charge amount is proportional to the power supply voltage Vdd and the capacity of the photodiode PD. Accordingly, with such a conventional arrangement, there is a need to increase the power supply voltage Vdd in order to increase the dynamic range. However, the increase in the power supply voltage Vdd negates the advantage of the CMOS image sensor, i.e., the ability to operate at a low voltage. Accordingly, such a countermeasure is not preferably employed.

SUMMARY OF THE INVENTION

The present invention has been made in view of the aforementioned problems. Accordingly, it is an object thereof to provide a photodetection apparatus having an increased dynamic range without an increase in the power supply voltage.

A first aspect of the present invention relates to a photodetection apparatus. This photodetection apparatus includes pixels each of which is provided at the intersection of multiple data lines and multiple scan lines. With such an arrangement, each of the pixels comprises: a photodetection device; a voltage output unit which outputs the data of the light intensity detected by the photodetection device in the form of a voltage value; and a current output unit which outputs the current flowing from the photodetection device. Furthermore, the photodetection apparatus further includes a control unit which effects control of each pixel so as to activate either the voltage output unit or the current output unit, thereby outputting either the voltage value or the current to the data line connected to the pixel.

Such an arrangement enables the form of a signal which is output from each pixel to be switched between voltage and current by switching the active output unit between the voltage output unit and the current output unit. This allows the signal processing method to be switched corresponding to the light intensity input to the photodetection device, thereby increasing the dynamic range of the photodetection apparatus. The term "photodetection device" as used here represents a device component having a function of causing electric current corresponding to the light amount input thereto. Examples of such photodetection device include photodiodes, phototransistors, and so forth.

The current output unit may include a current output transistor provided between one terminal of the photodetection device and the data line. Such an arrangement enables the current flowing from the photodetection device to be output to outside the pixel via the current output transistor and the data line by turning on the current output transistor while the other active devices are turned off.

Also, a current/voltage conversion unit, which has a function of converting the current output from the current output unit into voltage, may be provided for each of the data lines. Such an arrangement has a function of outputting the current to the outside of the pixel, and converting the current into voltage by a circuit outside of the pixel. This improves the degree of freedom in designing the circuit configuration of the current/voltage conversion unit. This enables the current to be converted into a voltage value over a wide current range, thereby increasing the dynamic range of the photodetection apparatus.

Also, the voltage output unit may have a function of charging and/or discharging the capacitance of a predetermined terminal provided within the pixel using the current, and outputting the voltage at the predetermined terminal as the voltage value after a predetermined period of time. With such an arrangement, in a case that the voltage output unit is controlled to be active, the voltage obtained as a result of integration of the current for a predetermined period of time is output. This enables very weak current to be detected.

Also, the photodetection device may be a photodiode. Also, the predetermined terminal may be the cathode terminal of the photodiode. With such an arrangement, first, the cathode terminal of the photodiode is charged. Then, the cathode terminal is discharged due to the photoelectric current for a predetermined period of time. As a result, voltage at the cathode terminal corresponding to the light intensity input to the photodiode. The voltage at the cathode terminal is read out, thereby outputting data in the form of a voltage value even if the light intensity is low.

Also, an arrangement may be made in which, in a case that the light intensity input to the photodetection device is greater than a predetermined threshold, the control unit controls the pixel such that the current output unit thereof becomes active. Also, an arrangement may be made in which, in a case that the light intensity input to the photodetection device is smaller than the predetermined threshold, the control unit controls the pixel such that the voltage output unit thereof becomes active. With such an arrangement, in a case of high light intensity, the current is directly read out by the current output unit, and current/voltage conversion is performed by a circuit outside of the pixel. On the other hand, in a case of low light intensity, current/voltage conversion is performed within the pixel. Such an arrangement increases dynamic range of the photodetection apparatus.

A second aspect of the present invention also relates to a photodetection apparatus. This photodetection apparatus includes multiple pixels. With such an arrangement, each of the pixels comprises: a photodiode, of which a first terminal is connected to a first fixed voltage terminal; an output terminal for outputting data corresponding the light intensity input to the photodiode; a reset transistor provided between a second terminal of the photodiode and a second fixed voltage terminal; an amplifier transistor, of which gate terminal is connected to the second terminal of the photodiode, and one terminal of which is connected to the second fixed voltage terminal; a voltage output transistor which is connected to the amplifier transistor in a cascode configuration, and connected to the output terminal; and a current output transistor provided between the second terminal of the photodiode and the output terminal. In a case of the voltage mode in which the current flowing from the photodiode is converted into a voltage and the converted voltage is output, the voltage output transistor is turned on, and the current output transistor is turned off. On the other hand, in a case of the current mode in which the current flowing from the photodiode is output, the voltage output transistor is turned off, and the current output transistor is turned on.

With such an arrangement, in the voltage mode, the data of the light intensity detected by the photodiode is output from the pixel in the form of a voltage value by turning on the voltage output transistor. On the other hand, in the current mode, the current flowing from the photodiode is output from the pixel by turning on the current output transistor. Thus, such an arrangement enables the form of a signal output from the pixel to be switched between voltage and current by switching the operation mode between the voltage mode and the current mode. This enables the signal processing method to be switched corresponding to the light amount input to the photodiode, thereby increasing the dynamic range of the photodetection apparatus.

A third aspect of the present invention also relates to a photodetection apparatus. This photodetection apparatus includes multiple pixels. With such an arrangement, each of the pixels comprises: a photodetection device; a first voltage output unit having a function of charging and/or discharging the capacitance of a predetermined terminal provided within the pixel using the current flowing from the photodetection device, and outputting the voltage at the predetermined terminal as an output signal after a predetermined period of time; and a second voltage output unit having a function of applying the current flowing from the photodetection device to an impedance device provided within the pixel, whereby the current is converted into a voltage, and outputting the converted voltage.

With such an arrangement, in a case that the first voltage output unit is controlled to be active, the voltage obtained by integrating the current is output. This provides high detection sensitivity for weak incident light. On the other hand, in a case that the second voltage output unit is controlled to be active, the current is directly converted into voltage by actions of the impedance device. This enables high-intensity incident light to be detected.

Also, the impedance of the impedance device may be controlled corresponding to the light intensity input to the photodetection device. With such an arrangement, in a case of high light intensity, the impedance of the impedance device is adjusted to be low. On the other hand, in a case of low light intensity, the impedance thereof is adjusted to be high. Such an arrangement provides the photodetection apparatus with an increased dynamic range.

A fourth aspect of the present invention also relates to a photodetection apparatus. This photodetection apparatus includes multiple pixels. With such an arrangement, each of the pixels comprises: a photodetection device of which a first terminal is connected to a first fixed voltage terminal; an output terminal for outputting data corresponding the light intensity input to the photodetection device; a reset transistor provided between a second terminal of the photodetection device and a second fixed voltage terminal; an amplifier transistor of which gate terminal is connected to the second terminal of the photodetection device; and a voltage output transistor which is connected to the amplifier transistor in a cascode configuration, and connected to the output terminal. With such an arrangement, the operation mode is switched between a first mode in which the reset transistor operates as a switching device which applies the second fixed voltage to the second terminal of the photodetection device, and a second mode in which the reset transistor operates as an impedance device which converts the current flowing from the photodetection device into voltage.

With such an arrangement, in the second mode, the reset transistor is used as an impedance device. Such an arrangement enables the current to be converted into voltage within the pixel. This enables the data of the light intensity to be output from the pixel in the form of a voltage value.

Also, an arrangement may be made in which, in the second mode, the bias of the reset transistor is controlled corresponding to the light intensity input to the photodetection device. Such an arrangement has a function of controlling the on-resistance by adjusting the bias of the transistor. This allows the on-resistance to be controlled corresponding to the intensity of the incident light, thereby providing proper photodetection.

It is to be noted that any arbitrary combination or rearrangement of the above-described structural components and so forth are all effective as and encompassed by the present embodiments.

Moreover, this summary of the invention does not necessarily describe all necessary features so that the invention may also be sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

First Embodiment

First, description will be made in outline regarding a photodetection apparatus according to a first embodiment of the present invention. The photodetection apparatus according to the present embodiment is a CMOS image sensor, and includes multiple pixels in the form of an m×n matrix. The photodetection apparatus has a function of operating in two modes, i.e., the current mode and the voltage mode, which are switched from one to the other corresponding to the intensity of the incident light as described later.

Figure 2:
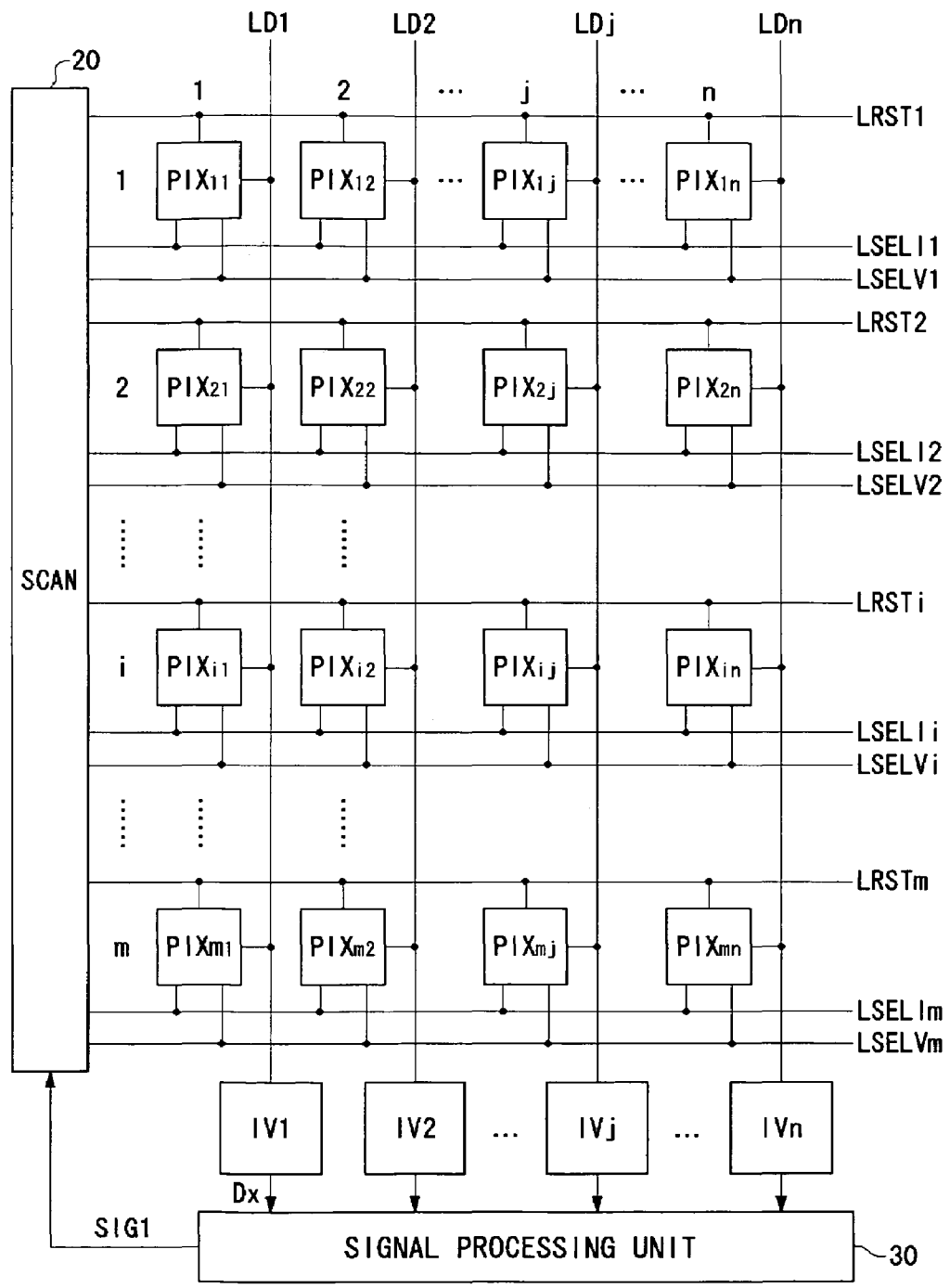
FIG. 2 is a circuit diagram which shows an overall configuration of a photodetection apparatus according to a first embodiment.

FIG. 2 is a circuit diagram which shows an overall configuration of the photodetection apparatus according to the first embodiment. A photodetection apparatus 500 includes: multiple pixels PIX arrayed in the form of a two-dimensional matrix with m rows and n columns (m and n are integers of 2 or more); n data lines LD1 through LDn, which will collectively be referred to as "data lines LD"; m reset lines LRST1 through LRSTm, which will collectively be referred to as "reset lines LRST"; m current selection lines LSELI1 through LSELIm, which will collectively be referred to as "current selection lines LSELI"; m voltage selection lines LSELV1 through LSELVm, which will collectively be referred to as "voltage selection lines LSELV"; n voltage/current detection circuits IV1 through IVn, which will collectively be referred to as "voltage/current detection circuits IV", and a signal processing unit 30.

Here, the pixel in the i'th row and the j'th column will be represented by "PIXij" for distinction of the multiple pixels thus arrayed in the form of a matrix. Each pixel PIX has the same structure, i.e., an active pixel structure including active device components, which enables the voltage applied to the photodiode to be controlled, and which enables a signal to be amplified, for pixel PIX.

Each of the n data lines LD1 through LDn is provided to the corresponding column. The pixels PIX1j through PIXmj of the j'th column are connected to the j'th column data line LDj. The light amount detected for each pixel is output to the data line LD connected to the pixel. Furthermore, each of the m reset lines LRST1 through LRSTm, each of the current selection lines LSELI1 through LSELIm, and each of the voltage selection lines LSELV1 through LSELVm, are provided to the corresponding row.

The scan control unit 20 outputs reset signals RST, current selection signals SELI, and voltage selection signals SELV, to the reset lines LRST, the current selection liens LSELI, and the voltage selection lines LSELV, respectively. The scan control unit 20 sequentially selects these lines of the first row to m'th row. Then, the scan control unit 20 outputs the reset signal RST, the current selection signal SELI, and the voltage selection signal SELV, to a selected row's reset line LRST, current selection line LSELI, and voltage selection line LSELV, respectively. This enables the light amount input to the pixels PIX in this row to be sequentially read out.

Note that each pixel PIX receives the power supply voltage Vdd via an unshown power line LVdd.

The reset signal RST is a signal for initializing each pixel. The reset signal RST is output prior to readout of data from the pixels in each row.

The scan control unit 20 outputs the voltage selection signal SELV in the voltage mode. On the other hand, the scan control unit 20 outputs the current selection signal SELI in the current mode. This enables the operation mode to be controlled for each pixel PIX. Specifically, a pixel having received the voltage selection signal SELV operates in the voltage mode. On the other hand, a pixel having received the current selection signal SELI operates in the current mode. The scan control unit 20 switches the operation mode between the voltage mode and the current mode in increments of a row or scan.

Figure 3:
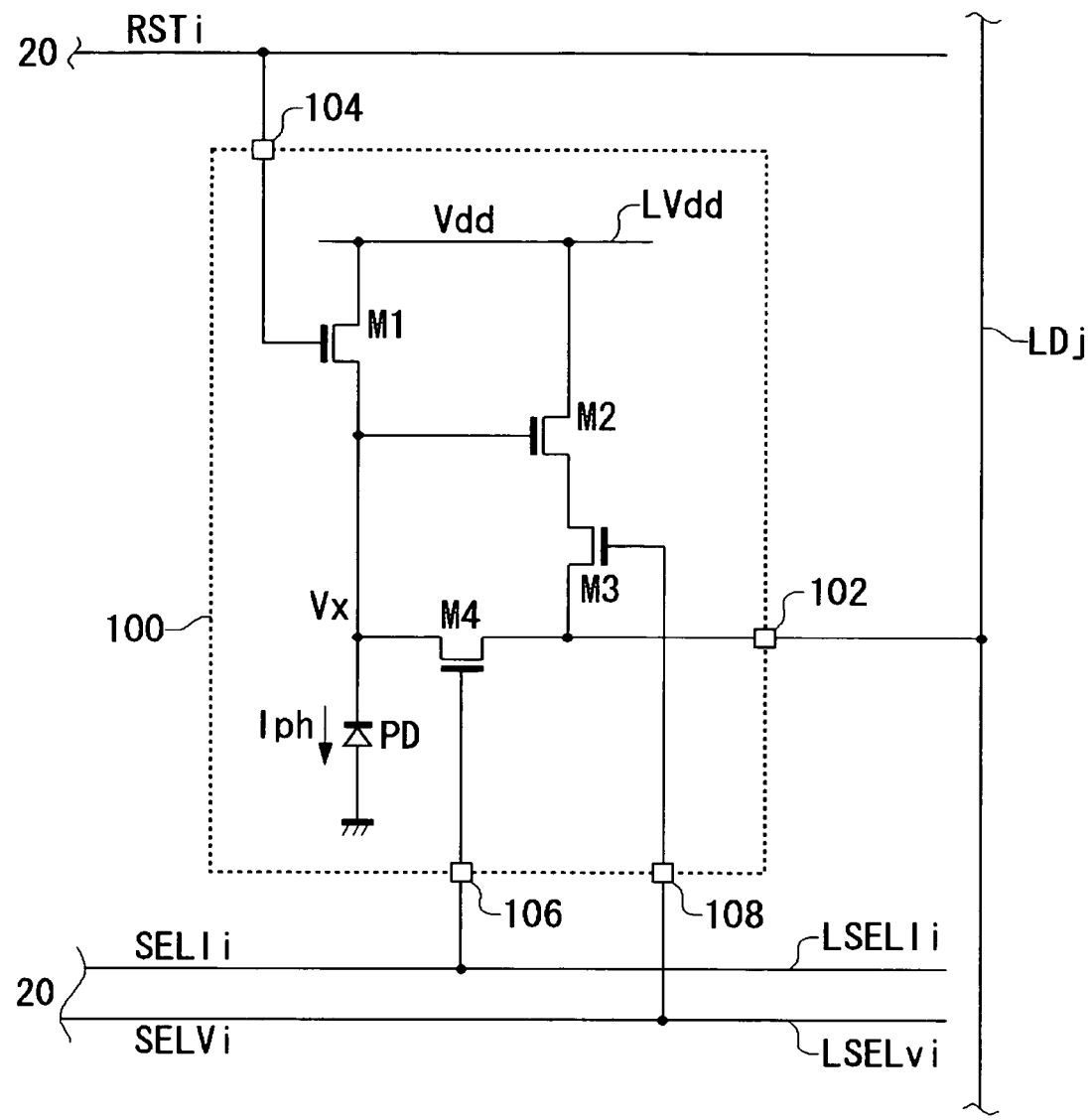
FIG. 3 is a circuit diagram which shows a configuration of a pixel circuit according the first embodiment.

FIG. 3 is a circuit diagram which shows a configuration of a pixel circuit 100 of each pixel PIXij in the i'th row and the j'th column, included in the photodetection apparatus 500 according to the present embodiment. The pixel circuit 100 includes a photodiode PD, a reset transistor M1, an amplifier transistor M2, a voltage output transistor M3, and a current output transistor M4. Furthermore, the pixel circuit 100 includes input/output terminals, i.e., an output terminal 102, a reset terminal 104, a current selection terminal 106, and a voltage selection terminal 108.

The pixel circuit 100 outputs the current or voltage via the output terminal 102 corresponding to the intensity of the light received by the photodiode PD. The output terminal 102 of each pixel circuit 100 is connected to the data line LDj of the column in which the pixel circuit 100 is provided. On the other hand, the reset terminal 104 of the pixel circuit 100 is connected to the reset line LRSTi of the row in which the pixel circuit 100 is provided. The reset signal RSTi output from the scan control unit 20 is input to the pixel circuit 100 via the reset line LRSTi. The current selection terminal 106 is connected to the current selection line LSELIi of the row in which the pixel circuit 100 is provided. The current selection signal SELIi output from the scan control unit 20 is input to the pixel circuit 100 via the current selection line LSELIi. The voltage selection terminal 108 is connected to the voltage selection line LSELVi of the row in which the pixel circuit 100 is provided. The voltage selection signal SELVi output from the scan control unit 20 is input to the pixel circuit 100 via the voltage selection line LSELVi.

Each of the reset transistor M1, amplifier transistor M2, voltage output transistor M3, and current output transistor M4, is an N-channel MOSFET. The reset transistor M1 and the photodiode PD are connected in series between the power supply voltage Vdd and the ground voltage GND. With regard to the reset transistor M1, the source terminal thereof is connected to the photodiode PD, and the power supply voltage Vdd is applied to the drain terminal thereof. The gate terminal of the reset transistor M1 is an input terminal for receiving the reset signal RST.

The cathode terminal of the photodiode PD, connected to the reset transistor M1, is also connected to the gate terminal of the amplifier transistor M2. With regard to the amplifier transistor M2, the power supply voltage Vdd is applied to the drain terminal thereof, and the source terminal thereof is connected to the drain terminal of the voltage output transistor M3, whereby the amplifier transistor M2 functions as a source follower amplifier.

The source terminal of the voltage output transistor M3 is connected to the output terminal 102 of the pixel circuit 100. Furthermore, the gate terminal thereof is connected to the voltage selection terminal 108, which serves as an input terminal for the voltage selection signal SELVi. Upon the voltage selection signal SELVi being switched to the high level, the voltage output transistor M3 is turned on. As a result, the voltage Vx of the cathode terminal of the photodiode PD is amplified, and is output from the output terminal 102.

With regard to the current output transistor M4, the source terminal and the drain terminal thereof effect a connection between the cathode terminal of the photodiode PD and the output terminal 102. The gate terminal of the current output transistor M4 is connected to the current selection terminal 106, and serves as an input terminal for the current selection signal SELIi output from the scan control unit 20. The on/off control of the current output transistor M4 is performed according to the switching of the current selection signal SELIi between the high level and the low level.

Description will be made regarding the operation of the pixel circuit 100, having such a configuration described above, in the voltage mode and the current mode.

First, description will be made regarding the operation in the voltage mode. In the voltage mode, the current selection signal SELIi is switched to the low level, thus turning off the current output transistor M4. Prior to detection of the intensity of the incident light, the pixel PIXij receives a high level reset signal RSTi. Upon the reset signal RSTi being switched to the high level, the reset transistor M1 is turned on, and accordingly, the power supply voltage Vdd is applied to the cathode terminal of the photodiode PD. Subsequently, the reset signal RSTi is switched to the low level, thus turning off the reset transistor M1.

In the next stage, the photoelectric current Iph flows from the photodiode PD corresponding to the intensity of the incident light. The photoelectric current Iph causes the charge accumulated in the cathode terminal of the photodiode PD to be discharged. This gradually reduces the voltage of the photodiode PD. Let us say that each pixel is exposed in the exposure time Texp. In this case, the charge $\Delta Q = Iph \times Texp$ is discharged. Let us say that the capacity of the cathode terminal of the photodiode PD is C. In this case, the voltage Vx of the cathode terminal of the photodiode PD after the exposure time Texp is represented by the Expression, $Vx = Vdd - Texp \times Iph/C$. After the exposure time Texp, the voltage selection signal SELVi is switched to the high level, thus turning on the voltage output transistor M3. Upon the voltage output transistor M3 being turned on, the amplifier transistor M2 operates as a source follower amplifier. This amplifies the voltage of the cathode terminal of the photodiode PD, and the voltage thus amplified is output to the data line LDj as a voltage signal.

Next, description will be made regarding the operation of the pixel circuit 100 in the current mode. In the current mode, the voltage selection signal SELVi is fixed to the low level, and the voltage output transistor M3 is thus controlled to be off during the current mode. Prior to detection of the intensity of the incident light, the pixel PIXij receives a high level reset signal RSTi in the same way as with the voltage mode. Upon the reset signal RSTi being switched to the high level, the reset transistor M1 is turned on, and accordingly, the power supply voltage Vdd is applied to the cathode terminal of the photodiode PD. Subsequently, the reset signal RSTi is switched to the low level, and the reset transistor M1 is thus turned off.

Next, the current selection signal SELIi is switched to the high level, and the current output transistor M4 is thus turned on. In this state, the photoelectric current Iph flows from the photodiode PD into the data line LDj via the current output transistor M4 and the output terminal 102. That is to say, in the current mode, each pixel PIX directly outputs the photoelectric current Iph, which flows from the photodiode PD, to the data line LDj.

Description will be made returning to FIG. 2. Each pixel outputs its voltage value to the corresponding voltage/current detection circuit IVj in the voltage mode. On the other hand, each pixel outputs the current to the corresponding voltage/current detection circuit IVj in the current mode.

With such an arrangement, in the voltage mode, the voltage/current detection circuit IVj amplifies the voltage signal as necessary, performs A/D conversion thereof, and outputs the digital data DV thus obtained to the subsequent signal processing unit 30.

Furthermore, the voltage/current detection circuit IV includes a current/voltage conversion circuit. With such an arrangement, in the current mode, the voltage/current detection circuit IV converts the current output from the pixel PIX into a voltage, and amplifies the voltage as necessary. Then, the voltage/current detection circuit IV performs A/D conversion of the voltage, and outputs the digital data DI thus obtained to the subsequent signal processing unit 30.

The signal processing unit 30 analyzes the digital data output from each voltage/current detection circuit IV, and determines the signal level input to each pixel PIX. In a case that determination has been made that the signal level is high, the current mode is selected. On the other hand, in a case that determination has been made that the signal level is low, the voltage mode is selected. The determination may be made by making a comparison between the signal level and a predetermined threshold level. The signal processing unit 30 notifies the scan control unit 20 of the operation mode thus obtained from the aforementioned determination results, in the form of a signal SIG1. The scan control unit 20 controls each pixel PIX in the selected operation mode according to instructions of the signal processing unit 30.

With such an arrangement, the voltage/current detection circuit IV outputs different kinds of data corresponding to the operation mode. Specifically, the voltage/current detection circuit IV outputs the digital data DV in the voltage mode. On the other hand, the voltage/current detection circuit IV outputs the digital data DI in the current mode. Accordingly, the signal processing unit 30 performs processing for continuously maintaining the linkage between these two kinds of digital data.

As described above, the photodetection apparatus 500 according to the present embodiment has a function of detecting the photoelectric current value in either the voltage mode or in the current mode, with the modes being switched as appropriate. In the voltage mode, the charge is discharged due to the photoelectric current Iph flowing for the predetermined exposure time Texp, and the light intensity is detected in the form of a voltage value. This enables weak light to be detected. However, in the voltage mode, the dynamic range is limited by the charge amount accumulated at the time of reset. This leads to difficulty in measuring high-intensity light with sufficient precision.

In order to solve the aforementioned problem, the photodetection apparatus 500 according to the present embodiment has a function as follows. That is to say, in a case that the intensity of the incident light has exceeded a threshold established as the maximum incident light intensity that can be detected in the voltage mode, the operation mode is switched from the voltage mode to the current mode.

In the current mode, the photoelectric light Iph flowing from the photodiode PD of each pixel PIX is directly input to the voltage/current detection circuit IV. With the present embodiment, the voltage/current detection circuits IV are provided outside of the pixel region. This allows these voltage/current detection circuits to be designed without the need to be concerned about limitations of the number of the device components such as transistors and so forth. This permits a high degree of freedom in the design of the current/voltage conversion circuit for converting a current signal into a voltage signal.

Figure 1:
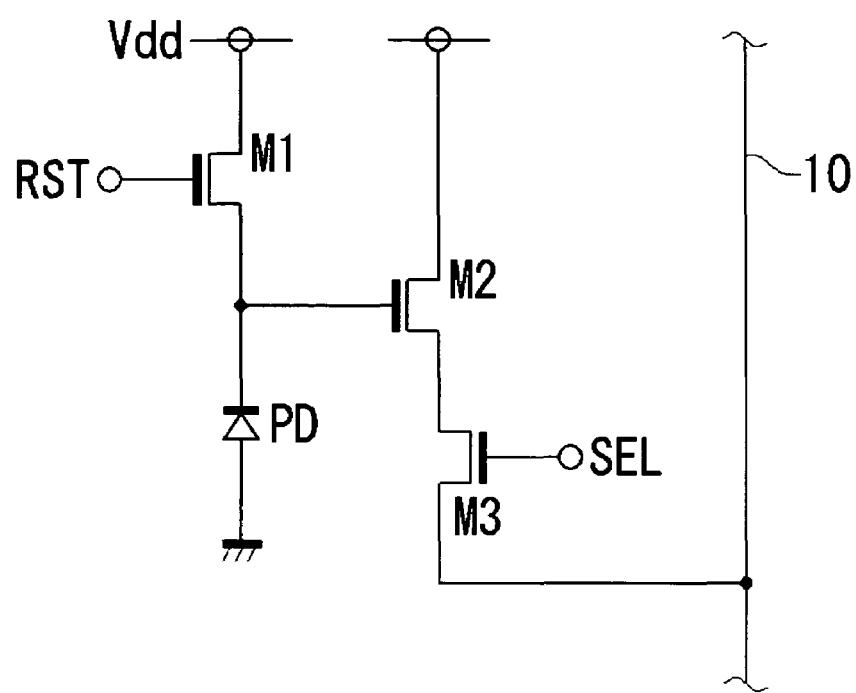
FIG. 1 is a circuit diagram which shows a configuration of a pixel circuit of a conventional CMOS image sensor.

According to the present embodiment, in a case of low incident light intensity, the photodetection apparatus 500 operates in the voltage mode. On the other hand, in a case of high incident light intensity, the photodetection apparatus 500 operates in the current mode. This provides an increased dynamic range. The photodetection apparatus 500 operates with generally the same power supply voltage Vdd being supplied to each of the pixels as with the conventional pixel circuit 200 shown in FIG. 1. This provides an increased dynamic range without negating the advantage of the CMOS image sensor, i.e., the ability to operate at a low voltage.

Furthermore, the photodetection apparatus 500 according to the present embodiment provides an increased dynamic range without adjustment of the exposure time Texp. This permits simple operation of the photodetection apparatus 500. It is not the intention of the present invention to exclude an arrangement having a function of adjusting the exposure time Texp. Rather, the present invention also provides circuit design with a higher degree of freedom using a combination of the adjustment of the exposure time Texp and the switching of the operation mode between the current mode and the voltage mode.

Second Embodiment

A photodetection apparatus according to a second embodiment operates in either the voltage mode or in the current mode, with the modes being switched as appropriate, in the same way as with the photodetection apparatus 500 according to the first embodiment. Description has been made in the first embodiment regarding an arrangement in which the pixel circuit 100 directly outputs the current flowing from the photodiode PD to the data line LD in the current mode, and the voltage/current detection circuit IV converts the current into a voltage signal. On the other hand, with a pixel circuit according to the present embodiment, the pixel circuit converts the current flowing from the photodiode PD into a voltage signal, and outputs the data to the data line LD in the form of a voltage signal. Such a current mode will be referred to as "active pixel current mode" hereafter.

Figure 4:
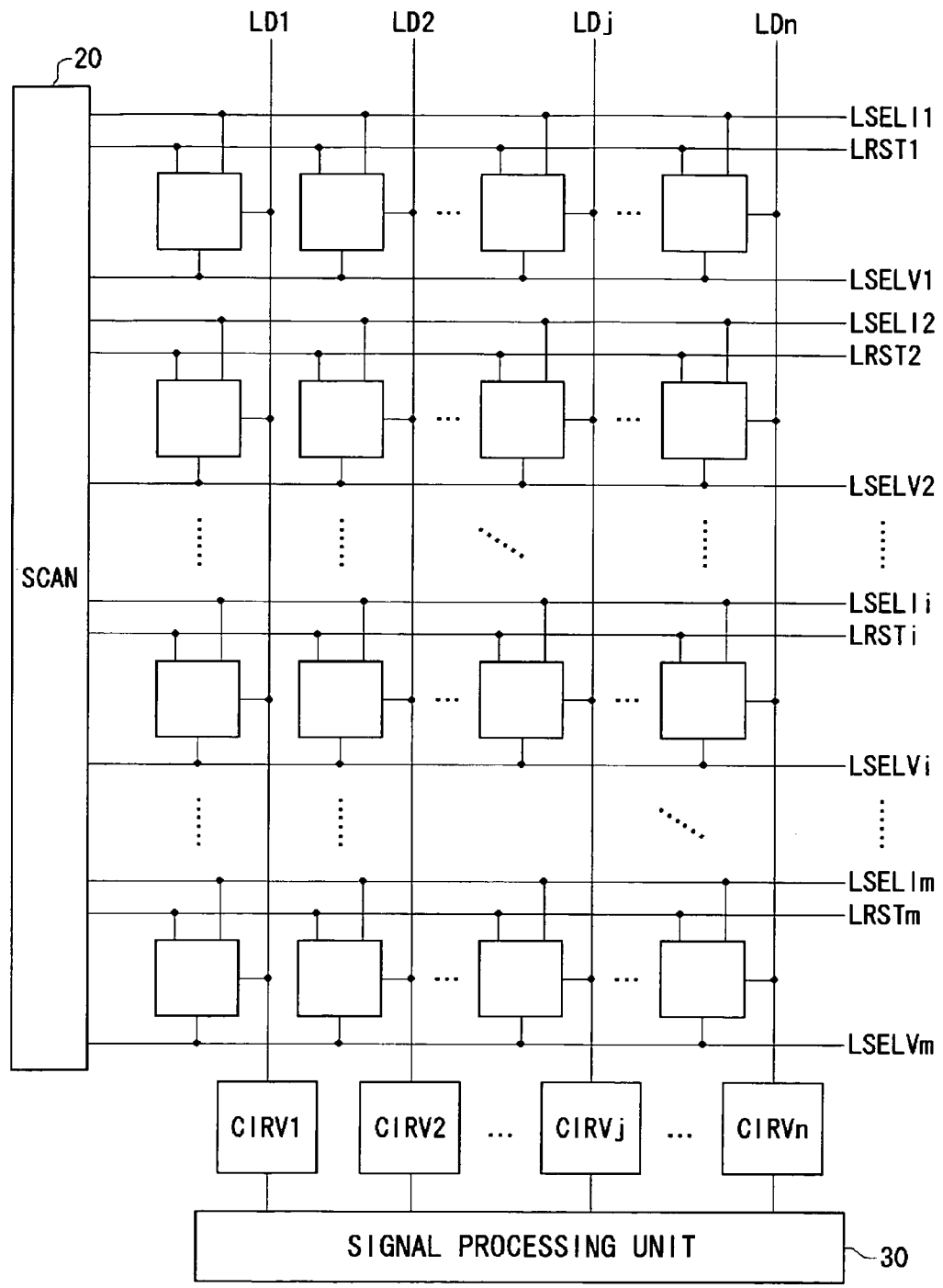
FIG. 4 is a circuit diagram which shows an overall configuration of a photodetection apparatus according to a second embodiment.
Figure 5:
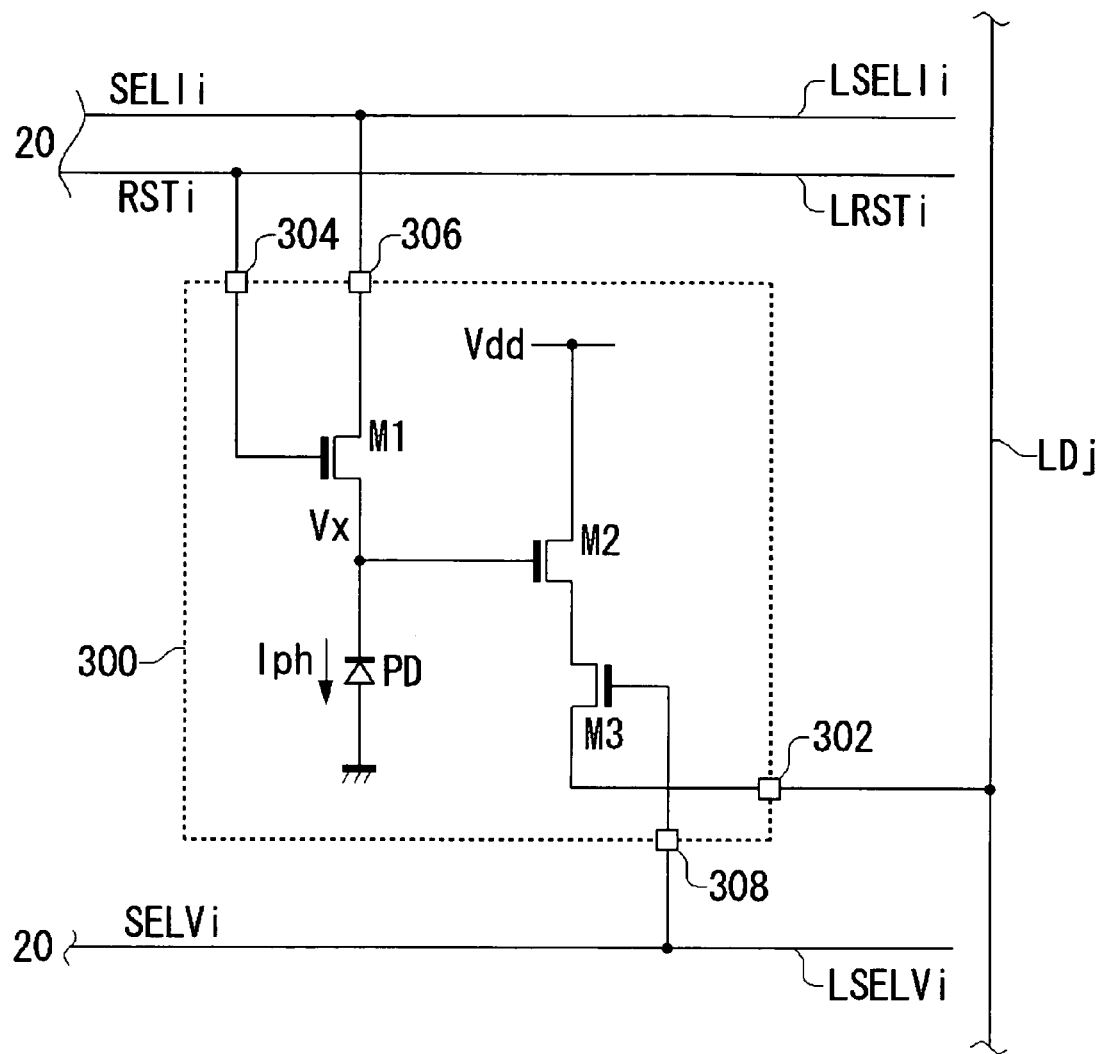
FIG. 5 is a circuit diagram which shows a configuration of a pixel circuit according to the second invention.

FIG. 4 is a circuit diagram which shows a configuration of a photodetection apparatus 600 according to the second embodiment. FIG. 5 is a circuit diagram which shows a configuration of a pixel circuit 300 according to the second embodiment. The same components shown in these drawings as those described above are denoted by the same reference numerals, and description thereof will be omitted as appropriate.

As described above, with the photodetection apparatus 600 according to the present embodiment, each pixel PIX converts the photoelectric current Iph into a voltage value in either the voltage mode or the active pixel current mode. Accordingly, there is no need to perform current/voltage conversion in the current mode, unlike an arrangement according to the first embodiment in which each voltage/current detection circuit IV performs the current/voltage conversion in the current mode. Accordingly, the photodetection apparatus 600 according to the present embodiment includes voltage detection circuits CIRV1 through CIRVn as shown in FIG. 4, instead of the voltage/current detection circuits IV1 through IVn.

Each of the voltage detection circuits CIRV1 through CIRVn amplifies the voltage signals output from the corresponding pixels PIX as necessary, performs A/D conversion of the voltage signal, and outputs the digital data thus obtained to the subsequent signal processing unit 30.

The pixel circuit 500 shown in FIG. 5 includes a photodiode PD, a reset transistor M1, an amplifier transistor M2, and a voltage output transistor M3. Furthermore, the pixel circuit 300 includes an output terminal 302, a reset terminal 304, a current selection terminal 306, and a voltage selection terminal 308, all of which are input/output terminals. The pixel circuit 300 outputs the voltage via the output terminal 302 corresponding to the intensity of incident light input to the photodiode PD.

Each of the reset transistor M1, amplifier transistor M2, and voltage output transistor M3, is an N-channel MOSFET.

The reset transistor M1 and the photodiode PD are connected in series between the power supply voltage Vdd and the ground voltage GND. The source terminal of the reset transistor M1 is connected to the photodiode PD.

The gate terminal of the reset transistor M1 is connected to the reset terminal 304, which serves as an input terminal for the reset signal RST. On the other hand, the drain terminal of the reset transistor M1 is connected to the current selection terminal 306, which serves as an input terminal for the current selection signal SELIi.

The cathode terminal of the photodiode PD, connected to the reset transistor M1, is also connected to the gate terminal of the amplifier transistor M2. With regard to the amplifier transistor M2, the power supply voltage Vdd is applied to the drain terminal thereof, and the source terminal thereof is connected to the drain terminal of the voltage output transistor M3, whereby the amplifier transistor M2 functions as a source follower amplifier.

The source terminal of the voltage output transistor M3 is connected to the output terminal 302 of the pixel circuit 300. Furthermore, the gate terminal thereof is connected to the voltage selection terminal 308, which serves as an input terminal for the voltage selection signal SELVi.

Description will be made regarding the operation of the pixel circuit 300 having such a configuration described above, in the voltage mode and in the active pixel current mode.

First, description will be made regarding the operation in the voltage mode. The pixel circuit 300 according to the present embodiment performs the same operation in the voltage mode as the operation in the voltage mode according to the first embodiment. In the voltage mode, the power supply voltage Vdd is applied to the current selection line LSELIi, and the power supply voltage Vdd is thus applied to the drain terminal of the reset transistor M1.

Prior to detection of the intensity of the incident light, the pixel PIXij receives a high level reset signal RSTi. Upon the reset signal RSTi being switched to the high level, the reset transistor M1 is turned on, and accordingly, the power supply voltage Vdd, which has been applied to the reset line LRSTi, is applied to the cathode terminal of the photodiode PD. As a result, the cathode terminal of the photodiode PD is charged with the power supply voltage Vdd. Subsequently, the reset signal RSTi is switched to the low level, and the reset transistor M1 is thus turned off.

In the next stage, the photoelectric current Iph flows from the photodiode PD corresponding to the intensity of the incident light. The charge accumulated in the cathode terminal of the photodiode PD is discharged due to the photoelectric current Iph. This gradually reduces the voltage of the photodiode PD. After the exposure time Texp, the voltage selection signal SELVi is switched to the high level, and the voltage output transistor M3 is thus turned on. As a result, the amplifier transistor M2 operates as a source follower amplifier. Thus, the voltage Vx at the cathode terminal of the photodiode PD is output to the data line LDj as a voltage signal.

Next, description will be made regarding the operation in the active pixel current mode. In the active pixel current mode, the reset transistor M1 functions as an impedance device. The scan control unit 20 applies the voltage VRST1 to the current selection lines LSELI, and applies the voltage VRST2 to the reset lines LRST. Furthermore, the scan control unit 20 sets the voltage selection signal SELVi to the low level, and the output transistor M3 is thus turned off. In this state, the photoelectric current Iph flows when the photodiode PD receives light. The photoelectric current Iph flows to the reset transistor M1.

Let us say that the reset transistor M1 has the on-resistance Ron. In this case, the voltage at the cathode of the photodiode PD is represented by the Expression $Vx=VRST1-Ron \times Iph$.

As can be understood from this Expression, the voltage Vx at the cathode terminal of the photodiode PD changes corresponding to the photoelectric current Iph.

In the active pixel current mode, the pixel circuit 300 receives the high level voltage selection signal SELVi via the voltage selection line LSELV, and the voltage output transistor M3 is thus turned on, in the same way as in the voltage mode. As a result, the amplifier transistor M2 amplifies the voltage at the cathode terminal Vx of the photodiode PD, and outputs the voltage thus amplified to the data line LD. Thus, the pixel circuit 300 according to the present embodiment uses the reset transistor M1 as an impedance device in the active pixel current mode, thereby converting the photoelectric current Iph into a voltage as an output signal.

With the pixel circuit 300, the voltage Vx at the cathode terminal of the photodiode PD also decreases corresponding to an increase in the photoelectric current Iph. In a case that the voltage Vx has become insufficient, the amplifier transistor M2 cannot function as a source follower amplifier. In order to solve this problem, the photodetection apparatus 600 according to the present embodiment has a function of adjusting the on-resistance Ron corresponding to the incident light intensity, i.e., the current value of the photoelectric current Iph. This enables the voltage Vx to be output to the data line LD over a greater dynamic range.

The on-resistance of the reset transistor M1 can be controlled by adjusting the bias state of the transistor, i.e., the voltages VRST1 and VRST2 applied to the gate terminal and the drain terminal. With the photodetection apparatus 600 shown in FIG. 4, the signal processing unit 30 notifies the scan control unit 20 of the output level of the voltage detection circuit CIRV. The scan control unit 20 controls the voltages VRST1 and VRST2 based upon the notification signal SIG2.

The photodetection apparatus 600 according to the present embodiment described above provides the reduced number of the transistors (three), which are provided within each pixel circuit 300. Furthermore, the pixel circuit 300 outputs the voltage signal to the data line LD in both the current mode and the voltage mode. Accordingly, the voltage detection circuit does not need to have a function of switching the detection mode between the current detection and the voltage detection. This offers a simple circuit configuration thereof.

Description has been made regarding the present invention with reference to the aforementioned embodiments. The above-described embodiments have been described -for exemplary purposes only, and are by no means intended to be interpreted restrictively. Rather, it can be readily conceived by those skilled in this art that various modifications may be made by making various combinations of the aforementioned components or the aforementioned processing, which are also encompassed in the technical scope of the present invention.

For example, description has been made in the above embodiments regarding an arrangement in which all the transistors employed in each pixel circuit are N-channel MOSFETs. The present invention is not restricted to such an arrangement. Also, an arrangement may be made in which P-channel MOSFETs are employed as components of the transistors provided in each pixel circuit. Such an arrangement operates with signals which are inverse of those used in the above-described embodiments, e.g., high level or low level signals, as the current selection signal SELI, the voltage selection signal SELV, and the reset signal RST, as appropriate.

For example, a modification of the second embodiment may be made in which the reset transistor M1 is a P-channel MOSFET. Such an arrangement enables the reset transistor M1 to be operated as a constant current load in the current mode. This allows the on-resistance Ron to be controlled, independent of the voltage Vx at the cathode terminal of the photodiode PD. On the other hand, in the voltage mode, with such an arrangement, the voltage Vx at the cathode terminal of the photodiode PD can be set to the power supply voltage Vdd by setting the reset signal RST to the low level.

Description has been made in the above embodiments regarding an arrangement in which each pixel includes a photodiode PD. Also, an arrangement may be made in which each pixel includes any kind of photodetection device having a function of causing a photoelectric current which changes corresponding to the intensity of the incident light, instead of the photodiode PD. Examples of such photodetection devices include phototransistors, and so forth.

While the preferred embodiments of the present invention have been described using specific terms, such description is for illustrative purposes only, and it is to be understood that changes and variations may be made without departing from the spirit or scope of the appended claims.

What is claimed is:

1. A photodetection apparatus including pixels each of which is provided at the intersection of a plurality of data lines and a plurality of scan lines, wherein each of said pixels comprises:
    a single photodetection device;
    a voltage output unit which outputs the data of the light intensity detected by said single photodetection device in the form of a voltage value; and
    a current output unit which outputs the current flowing from said single photodetection device, and
    wherein said voltage output unit and said current output unit share said single photodetection device, and
    wherein said photodetection apparatus further includes a control unit which effects control of each pixel so as to activate either said voltage output unit or said current output unit, thereby outputting either said voltage value or said current to the data line connected to the pixel.

2. The photodetection apparatus according to claim 1, wherein said voltage output unit has a function of charging and/or discharging the capacitance of a predetermined terminal provided within the pixel using said current, and outputting the voltage at said predetermined terminal as said voltage value after a predetermined period of time.

3. The photodetection apparatus according to claim 2, wherein said photodetection device is a photodiode, and wherein said predetermined terminal is the cathode terminal of said photodiode.

4. A photodetection apparatus including a plurality of pixels, wherein each of said pixels comprises:
    a photodiode, of which a first terminal is connected to a first fixed voltage terminal;
    an output terminal for outputting data corresponding the light intensity input to said photodiode;
    a reset transistor provided between a second terminal of said photodiode and a second fixed voltage terminal;
    an amplifier transistor, of which gate terminal is connected to the second terminal of said photodiode, and one terminal of which is connected to said second fixed voltage terminal;
    a voltage output transistor which is connected to said amplifier transistor in a cascode configuration, and connected to said output terminal; and
    a current output transistor provided between the second terminal of said photodiode and said output terminal, wherein, in a case of the voltage mode in which the current flowing from the photodiode is converted into a voltage and the converted voltage is output, said voltage output transistor is turned on, and said current output transistor is turned off, and wherein, in a case of the current mode in which the current flowing from the photodiode is output, said voltage output transistor is turned off, and said current output transistor is turned on.

5. A photodetection apparatus including pixels each of which is provided at the intersection of a plurality of data lines and a plurality of scan lines, wherein each of said pixels comprises:
    a photodiode;
    a voltage output unit which outputs the data of the light intensity detected by said photodiode in the form of a voltage value; and
    a current output unit which outputs the data of the light intensity detected by said photodiode in the form of a current value, and wherein said photodetection apparatus further includes a control unit which controls each pixel so as to activate either said voltage output unit or said current output unit, thereby outputting either said voltage value or said current to the data line connected to the pixel.

6. A photodetection apparatus including pixels each of which is provided at the intersection of a plurality of data lines and a plurality of scan lines, wherein each of said pixels comprises:
    a photodetection device;
    a voltage output unit which outputs the data of the light intensity detected by said photodetection device in the form of a voltage value; and
    a current output unit which outputs the current flowing from said photodetection device, and wherein said photodetection apparatus further includes a control unit which effects control of each pixel so as to activate either said voltage output unit or said current output unit, thereby outputting either said voltage value or said current to the data line connected to the pixel,
    wherein a current/voltage conversion unit, which has a function of converting the current output from said current output unit into voltage, is provided for each of said data lines.

7. A photodetection apparatus including pixels each of which is provided at the intersection of a plurality of data lines and a plurality of scan lines, wherein each of said pixels comprises:
    a photodetection device;
    a voltage output unit which outputs the data of the light intensity detected by said photodetection device in the form of a voltage value; and
    a current output unit which outputs the current flowing from said photodetection device, and wherein said photodetection apparatus further includes a control unit which effects control of each pixel so as to activate either said voltage output unit or said current output unit, thereby outputting either said voltage value or said current to the data line connected to the pixel,
    wherein, in a case that the light intensity input to said photodetection device is greater than a predetermined threshold, said control unit controls the pixel such that said current output unit thereof becomes active, and wherein, in a case that the light intensity input to said photodetection device is smaller than said predetermined threshold, said control unit controls the pixel such that said voltage output unit thereof becomes active.

* * * * *